US010540476B2

(12) United States Patent
Okuno

(10) Patent No.: US 10,540,476 B2
(45) Date of Patent: Jan. 21, 2020

(54) COMPUTER-IMPLEMENTED METHOD FOR SIMPLIFYING ANALYSIS OF A COMPUTER-AIDED MODEL

(71) Applicant: HITACHI, LTD., Tokyo (JP)

(72) Inventor: Azuma Okuno, Bangalore (IN)

(73) Assignee: HITACHI, LTD., Tokyo (JP)

( * ) Notice: Subject to any disclaimer, the term of this patent is extended or adjusted under 35 U.S.C. 154(b) by 605 days.

(21) Appl. No.: 15/346,996

(22) Filed: Nov. 9, 2016

(65) Prior Publication Data
US 2017/0140091 A1    May 18, 2017

(30) Foreign Application Priority Data
Nov. 16, 2015 (IN) .......................... 6161/CHE/2015

(51) Int. Cl.
*G06F 17/50* (2006.01)
(52) U.S. Cl.
CPC ...... *G06F 17/5086* (2013.01); *G06F 17/5018* (2013.01)
(58) Field of Classification Search
CPC .................... G06F 17/5086; G06F 17/5018
USPC ............................................. 703/1
See application file for complete search history.

(56) References Cited

U.S. PATENT DOCUMENTS

| 9,129,075 | B2* | 9/2015 | Onodera | G06F 17/50 |
| 2007/0176924 | A1 | 8/2007 | Uraki | |
| 2008/0036765 | A1 | 2/2008 | Hariya et al. | |
| 2009/0012752 | A1 | 1/2009 | Graning et al. | |
| 2010/0004769 | A1* | 1/2010 | Holden | G06F 17/5086 700/97 |
| 2012/0179426 | A1* | 7/2012 | Fontes | G06F 17/5018 703/1 |
| 2013/0185041 | A1* | 7/2013 | Stander | G06F 17/5095 703/6 |
| 2013/0226530 | A1* | 8/2013 | Onodera | G06T 17/20 703/1 |
| 2014/0365180 | A1* | 12/2014 | Lam | G06F 17/5004 703/1 |

OTHER PUBLICATIONS

Naceur H et al., "Response surface methodology for design of sheet forming parameters to control springback effects", Jul. 5, 2006, computers and structures, pergamon press, GB, vol. 84, No. 26-27, pp. 1651-1663.*

* cited by examiner

*Primary Examiner* — Juan C Ochoa
(74) *Attorney, Agent, or Firm* — Volpe and Koenig, P.C.

(57) ABSTRACT

The present disclosure discloses a computer-implemented method for simplifying analysis of a computer-aided model. The method comprising acts of selecting at least one evaluation point in a standard computer-aided model, analyzing the standard computer-aided model by simplifying each of a plurality of simplification points for the selected at least one evaluation point. Further the computer-implemented method comprises acts of building a response surface using relationship between simplification parameters and evaluation parameter based on analysis of the standard computer-aided model and indicating effect of simplification of at least one simplification point in the computer-aided model by comparing calculated evaluation parameter of the computer-aided model with a threshold evaluation parameter, wherein, the calculated evaluation parameter is derived using the response surface.

11 Claims, 9 Drawing Sheets

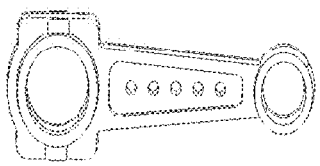
FIG.5A
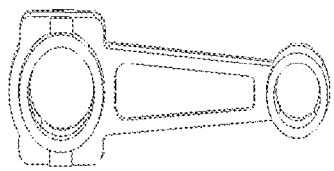
FIG.5B
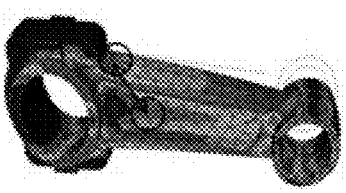
FIG.5C
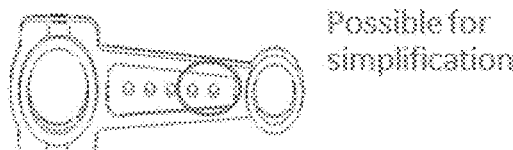
FIG.5D
| Feature | Y(Mpa) | Judge(Y0=20MPa) |
|---|---|---|
| Hole1 | 61 | NG |
| Hole2 | 56 | NG |
| Hole3 | 37 | NG |
| Hole4 | 15 | OK |
| Hole5 | 5 | OK |
FIG.5E

Application stage                                    X

Analysis model :   D:\Analysis\Analysis_010.dat    [ Ref ]

Threshold(Y0) :    20 [Mpa]

[ Execution ]    [ Cancel ]

Application stage(Result)                            X

Geometry

Hole2  Hole4
    Hole1  Hole3  Hole5

Evaluation result

| Feature | Y(Mpa) | Judge(Y0=20MPa) |
|---------|--------|-----------------|
| Hole1   | 61     | NG              |
| Hole2   | 56     | NG              |
| Hole3   | 37     | NG              |
| Hole4   | 15     | OK              |
| Hole5   | 5      | OK              |

FIG.6B

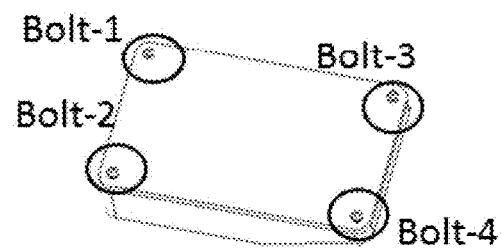
FIG.8A
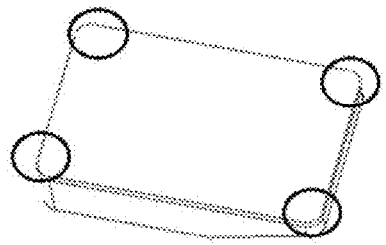
FIG.8B
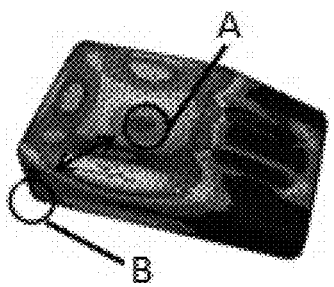
FIG.8C
| Feature | Y(Mpa) | Judge(Y0=20MPa) |
|---|---|---|
| Bolt-1 | 61 | NG |
| Bolt-2 | 56 | NG |
| Bolt-3 | 15 | OK |
| Bolt-4 | 17 | OK |
FIG.8D

COMPUTER-IMPLEMENTED METHOD FOR SIMPLIFYING ANALYSIS OF A COMPUTER-AIDED MODEL

TECHNICAL FIELD

The present disclosure generally relates to the field of analysis of components or assemblies. Particularly, but not exclusively the present disclosure relates to mechanical analysis of a computer-aided model. Further embodiments of the disclosure disclose a computer-implemented method for simplifying analysis of the computer-aided model.

BACKGROUND OF THE DISCLOSURE

In design stage of mechanical components, uncertainty in both the environmental load and the material parameters needs to be taken into consideration. Also safety margins are necessary to be developed to guarantee reliability of mechanical components. The safety margins are determined by safety factor, which is comprehensively used in the practical design of mechanical components. Generally, the safety factors are industry specific and determined by the experience of engineers. However, the empirical safety factor cannot quantify the uncertainty and risk in mechanical design. Therefore, analysis of mechanical products has gained more and more popularity. However, physical prototyping and testing or analyzing of mechanical components involves significant expenses and time. This has led to the usage of analysis softwares which has proven to show analysis results close to the physical analysis. In this case, a replicate of the mechanical components to be analyzed are produced in the form of a computer-aided models using design softwares which is later fed into the analysis software for detail analysis of the product. In industrial applications, the 3-D models of the mechanical components which are to be analyzed are generally very complex and include intricate geometrical shapes of every small component, i.e. the components involve lots of features and parts to be analyzed.

When the 3-D models of aforementioned type are analyzed using analysis software, the software generates a large number of meshes to represent each part. For instance, a large number of small meshes are generated for a curved portion in order to represent the shape of the modeling data in high fidelity, so that the number of divisions or the mesh formation becomes large. Consequently, since the analysis or computational time is directly dependent on the number of fine meshes generated, the analysis time increases substantially. For this reason, simplification of the features of 3-D computer-aided model which does not affect the overall analysis results was considered. However, the simplification of features was merely based on the user's experience, but for such acts a vast experience in the subject field is necessary and even in case of vast experience, the simplification may not be accurate enough. Further, it becomes difficult for beginners to judge the features that could be simplified.

With the on-going research and development in the area of analysis, some of the methods have been developed to simplify the analysis of the Computer Aided (CAD) models. One of the methods include process to simplify the analysis by taking geometry of features into consideration, i.e. if two or more features in the CAD model have similar geometry, then such features are simplified, and only one of those features is considered for analysis. However, in the conventional methods, other parameters which influence the analysis results are not taken into consideration. Thus, the simplified CAD model would not give accurate analysis results and hence the results cannot be considered for determining safety factors of components.

In light of foregoing discussion, there is a need to develop an improved computer-implemented method for simplifying the analysis of a computer-aided model to overcome one or more limitations stated above.

SUMMARY OF THE DISCLOSURE

One or more shortcomings of the conventional systems are overcome by system and method as claimed and additional advantages are provided through the provision of system and method as claimed in the present disclosure. Additional features and advantages are realized through the techniques of the present disclosure. Other embodiments and aspects of the disclosure are described in detail herein and are considered a part of the claimed disclosure.

In one non-limiting embodiment of the disclosure, there is provided a computer-implemented method for simplifying analysis of a computer-aided model. The method comprising acts of, selecting at least one evaluation point in a standard computer-aided model, analyzing the standard computer-aided model by simplifying each of a plurality of simplification points for the selected at least one evaluation point. The computer-implemented method further comprises acts of building a response surface using relationship between simplification parameters and evaluation parameter based on analysis of the standard computer-aided model. Further, the method comprises act of indicating effect of simplification of at least one simplification point in the computer aided model by comparing calculated evaluation parameter of the computer aided model with a threshold evaluation parameter, wherein, the calculated evaluation parameter is derived using the response surface.

In an embodiment of the present disclosure, the evaluation parameter and simplification parameters are determined during analysis of the standard computer aided model.

In an embodiment of the disclosure, the evaluation parameter is a parameter to be evaluated in at least one evaluation point and the evaluation parameter is a function of the simplification parameters.

In an embodiment of the disclosure, the standard computer-aided model is analyzed for a plurality of evaluation points by simplifying each of the plurality of simplification points for the selected evaluation point of the plurality of evaluation points.

In an embodiment of the disclosure, the response surface of the standard computer-aided model is stored in a memory unit.

In an embodiment of the disclosure, the simplification parameters are determined by analyzing the computer-aided model.

In another non-limiting embodiment of the disclosure, there is provided a system for simplifying analysis of a computer-aided model. The system comprising a processing unit and a memory unit communicatively coupled to the processing unit, wherein the memory unit stores processor-executable instructions. The instructions on execution, causes the processing unit to select at least one evaluation point in a standard computer-aided model, analyze the standard computer-aided model by simplifying each of a plurality of simplification points for the selected at least one evaluation point. Then, build a response surface using relationship between simplification parameters and evaluation parameter based on analysis of the standard computer-aided model. The processing unit also indicate effect of simplification of at least one simplification point in the computer aided model by comparing calculated evaluation parameter of the computer aided model with a threshold evaluation parameter, wherein, the calculated evaluation parameter is derived using the response surface.

In an embodiment of the disclosure, the system comprises a display unit interfaced with the processing unit to indicate the effect of simplification.

It is to be understood that aspects and embodiments of the disclosure described above may be used in any combination with each other. Several aspects and embodiments may be combined together to form a further embodiment of the disclosure.

The foregoing summary is illustrative only and is not intended to be in any way limiting. In addition to illustrative aspects, embodiments, and features described above, further aspects, embodiments, and features will become apparent by reference to drawings and the following detailed description.

BRIEF DESCRIPTION OF THE ACCOMPANYING FIGURES

The disclosure itself, however, as well as a preferred mode of use, further objectives and advantages thereof, will best be understood by reference to the following detailed description of an illustrative embodiment when read in conjunction with the accompanying figures. One or more embodiments are now described, by way of example only, with reference to the accompanying figures wherein like reference numerals represent like elements and in which:

FIGS. 5A to 5E illustrates structural analysis of a connecting rod in the application stage, in accordance with an exemplary embodiment of the present disclosure.

FIG. 6B illustrates graphic user interface of the system, for structural analysis of a connecting rod in the application stage.

FIGS. 8A to 8D illustrates structural analysis of a computer mouse in the application stage, in accordance with another exemplary embodiment of the present disclosure.

Figure 1:
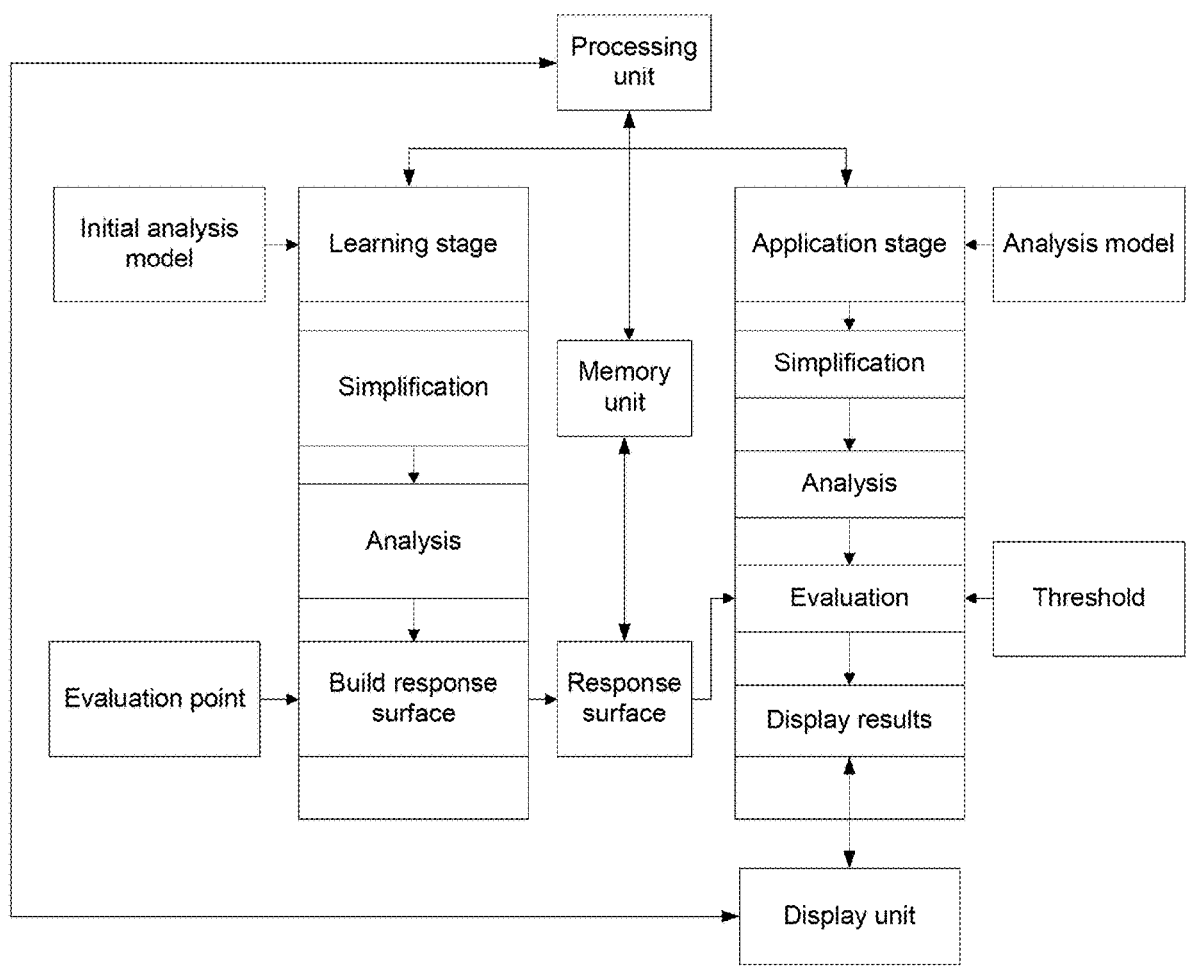
FIG. 1 illustrates block diagram of a system for simplifying analysis of a computer-aided model according to an embodiment of the disclosure.

It should be appreciated by those skilled in the art that any block diagrams herein represent conceptual views of illustrative systems embodying the principles of the present subject matter. Similarly, it will be appreciated that any flow charts, flow diagrams, state transition diagrams, pseudo code, and the like represent various processes which may be substantially represented in computer readable medium and executed by a computer or processor, whether or not such computer or processor is explicitly shown.

The figures depict embodiments of the disclosure for purposes of illustration only. One skilled in the art will readily recognize from the following description that alternative embodiments of the system illustrated herein may be employed without departing from the principles of the disclosure described herein.

DETAILED DESCRIPTION

The foregoing has broadly outlined the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures for carrying out the same purposes of the present disclosure. It should also be realized by those skilled in the art that such equivalent constructions do not depart from the scope of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

Embodiments of the present disclosure disclose a computer-implemented method for simplifying analysis of a computer-aided model. The present disclosure is aimed at reducing the computational or the analysis time of the computer-aided model by simplifying analysis of the computer-aided model.

To overcome one or more drawbacks mentioned in the background, the present disclosure discloses a computer-implemented method for simplifying analysis of a Computer-Aided (CAD) model. The computer-implemented method of the present disclosure helps the user/analyzer to simplify certain features in the CAD model during mechanical analysis of the components. This simplification reduces analysis time of the CAD model using the analysis tools or software. The computer implemented method comprises a plurality of steps followed for simplifying the analysis. Firstly, the method includes a learning stage in which a standard CAD model is analyzed, and results are stored in a memory unit. The analysis of standard CAD model includes acts of selecting at least one evaluation point in a standard computer-aided model and analyzing the standard computer-aided model by simplifying each of a plurality of simplification points for the selected at least one evaluation point. The computer-implemented method further comprises acts of building a response surface using relationship between simplification parameters and evaluation parameter based on analysis of the standard computer-aided model. The next stage of implication includes analysis stage or application stage. In this stage the user imports the CAD model to be analyzed and subject it for simplification. During, this stage the computer implemented method indicates effect of simplification of at least one simplification point in the computer aided model by comparing calculated evaluation parameter of the computer aided model with a threshold evaluation parameter. The calculated evaluation parameter is derived using the response surface. The indication of effect of simplification helps the user to simplify the points which do not affect the results, and thereby reduce the analysis time. This method also improves the accuracy of the analysis results by avoiding manual errors.

In an embodiment of the disclosure, the standard computer-aided model is analyzed for a plurality of evaluation points by simplifying each of the plurality of simplification points for the selected evaluation point of the plurality of evaluation points. The analysis results are stored in a memory unit in the form of response surface and are used for analyzing any CAD models which is derived from the standard computer aided model.

In an embodiment of the disclosure, the method as described above is performed by a system comprising processing unit, a memory unit and the display unit. The memory unit mainly stores the built response surface and the display unit indicates to the user, the effect of simplification on a display unit.

The term computer aided model referred herein above and below refers to a model of the component or assembly generated/created using software. The model created by the software would include all the features, dimensions, characteristics and properties of the physical model.

The term standard computer aided model referred herein above and below refers to a basic computer aided model of any component or assembly. This basic CAD model can be used for deriving any model with certain variations.

The term mechanical analysis referred herein above and below refers to analysis of CAD models using the analysis tool or analysis software. The mechanical analysis includes but not limiting to structural analysis, thermal analysis, fluid flow analysis, etc. The mechanical analysis is performed for studying behavior of the component in various conditions before developing prototype or actual model.

The terms "comprises", "comprising", or any other variations thereof used in the specification, are intended to cover a non-exclusive inclusion, such that a system or method that comprises a list of components or steps does not include only those components or steps but may include other components or steps not expressly listed or inherent to such setup or method. In other words, one or more elements in a system or apparatus proceeded by "comprises . . . a" does not, without more constraints, preclude the existence of other elements or additional elements in the system or apparatus.

Henceforth, the present disclosure is explained with the help of one or more figures of exemplary embodiments. However, such exemplary embodiments should not be construed as limitations of the present disclosure.

FIG. 1 is an exemplary embodiment of the present disclosure, which illustrates block diagram of a system (100) for simplifying analysis of a Computer-Aided (CAD) model. The system (100) primarily comprises of a processing unit (101) which works as a medium for carrying out the simplification process. The system (100) further comprises a memory unit (102) which is interfaced with the processing unit (101). The memory unit is configured to store data which is accessible by the processing unit (101). The system further includes a display unit (103) interfaced with the processing unit (101) to indicate analysis results to the user. The system (100) carries out its function of simplifying analysis of a computer-aided model through two stages, the first stage being the learning stage and the second stage is called as application stage. The two stages—learning stage and the application stage are interfaced by the response surface stored in the memory unit (102).

In the learning stage of the simplification process, various computer aided models are analyzed in detail using the analysis softwares, and the results are stored in the memory unit (102). The CAD model is basically a reflection of the actual mechanical structure or assembly which is to be analyzed. The model which is selected at this stage is referred to as the standard computer-aided model. The standard computer-aided model is in general a complex mechanical structure or an assembly of mechanical components and the standard computer-aided model is used a reference for the analysis in the application stage. Considering the complexity of the standard computer-aided model so selected, mesh time and hence computational or analysis time of the standard-aided model is very high. Therefore, to reduce the computational time of the computer-aided model, simplification becomes necessary. Once the standard computer-aided model is subjected for simplification, the model is analyzed for various evaluation points and simplification points. During analysis of the standard CAD model, at least one point for evaluation in the standard computer-aided model is considered, and a parameter to be evaluated at the evaluation point is selected. The processing unit (101) of the system (100) identifies a plurality of simplification points based on selection of the evaluation point and the evaluation parameter. The processing unit (101) further identifies a plurality of simplification parameters that affect the results of the evaluation parameter at the evaluation point. Then the processing unit (101) simplifies a feature at one of the plurality of simplification points and standard computer-aided model is analyzed with the simplification or elimination of this feature. This analysis is repeated with simplification of feature at other simplification points for all the simplification points. Based on the analysis carried out by the processing unit (101) after simplification of features at each simplification point, the system builds a response surface. The response surface represents the relationship between the evaluation parameters and the simplification parameters. Generally, the evaluation parameter is a function of the simplification parameters.

In an embodiment of the disclosure, the relationship between the evaluation parameter and simplification parameters is arrived at after carrying out a plurality of iterations considering all the concerned simplification points and simplification parameters. Further, the analysis is not restricted to a single evaluation point or parameter, there may be multiple evaluation points and evaluation parameters for the same standard computer-aided model. In an exemplary embodiment of the disclosure, building of response surface i.e. the relationship between the evaluation parameters and simplification parameters includes plotting points in a multiplanar graphical space to depict dependencies between the evaluation parameter and the simplification parameters, wherein the graphical space has evaluation parameter and simplification parameters as different axes. This way the response surface or the relationship between the evaluation parameter and simplification parameters is built and is stored in the memory unit (102) of the system (100). The response surface can be accessed by the processing unit (101) for its execution in further stages for simplification of analysis of any computer-aided model.

In application stage of the functioning of system (100) the user can do any variations on the standard CAD model for mechanical analysis. When a fresh computer-aided model is considered for analysis the processing unit (101) processes the computer-aided model to be analyzed and it relates the computer-aided model to the closest standard computer-aided model stored in the memory unit (102). The processing unit (101) further calculates the simplification parameters that affect the results of the evaluation parameters. The computer-aided model is then subject to simplification of features at a plurality of simplification points and the computer-aided model to analyze by meshing the model. In this stage, the evaluation parameter of the computer-aided model is calculated using the response surface. The calculation of evaluation parameter is based on the response surface built in the learning stage for a substantially similar model. The response surface which is stored in the memory unit (102) is accessed by the processing unit (101) to calculate the evaluation parameter of the computer-aided model. The response surface stored in the memory unit (102) is in the form of a relationship between the simplification parameters and the evaluation parameter and generally the evaluation parameter is a function of the simplification parameters. The computational time or the analysis time is reduced significantly in this stage as the calculation of evaluation parameter is done using the response surface built in the learning stage. The relationship between the simplification parameters and the evaluation parameter brought out in the response surface in the learning stage allows for quicker analysis of the computer-aided model in the application stage. Further, the user inputs the threshold value of the evaluation parameter which is processed by the processing unit (101). Upon processing of the threshold value and calculation of the evaluation parameter, the processing unit (101) compares the results of the calculated evaluation parameter with the input threshold value of the evaluation parameter. The results of the comparison are indicated to the user by a display unit (103). The display unit (103) indicates the results to the user to judge the effect of simplification and to ensure that the features simplified in the computer-aided model does not compromise with the analysis results i.e. to say when a fresh analysis is carried out after simplification of the features in the computer-aided model the analysis results doesn't deviate much from the analysis results obtained before simplification of features.

While building the response surface in the learning stage each of the plurality of evaluation parameter is analyzed for a plurality of simplification parameters, and the relationship between them will be stored. This response surface helps to reduce the analysis time during fresh analysis of a computer-aided model in the application stage. In this way, the system (100) simplifies the computer-aided model to be analysed and saves time in computation.

Figure 2:
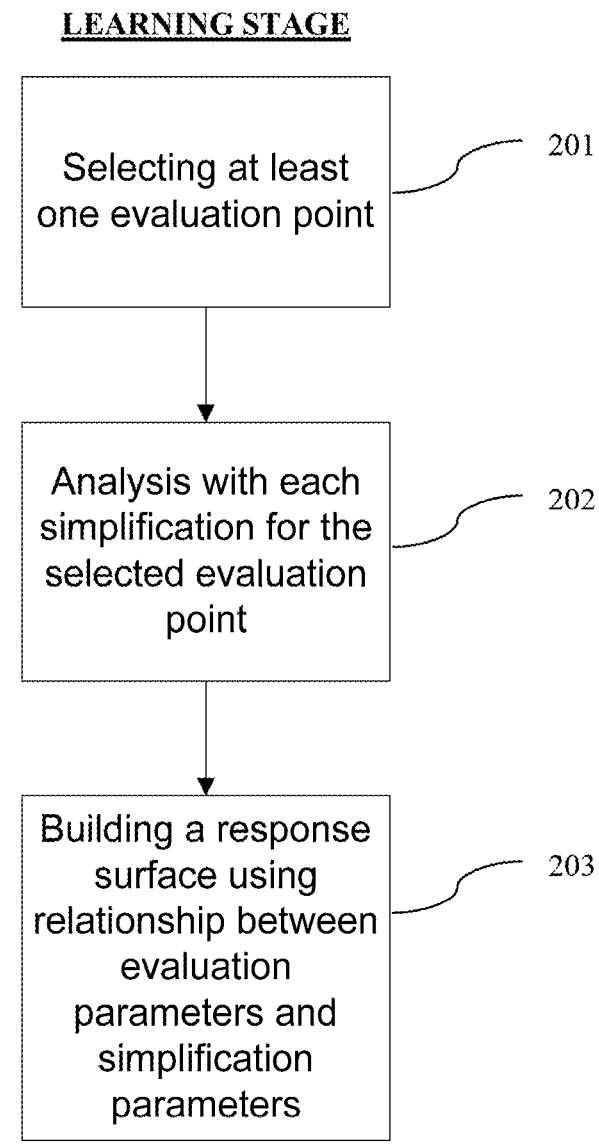
FIG. 2 illustrates a flow chart showing different steps performed by the system of FIG. 1 in the learning stage, in accordance with some embodiment of the present disclosure.

FIG. 2 is an exemplary embodiment of the present disclosure, which illustrates a flow chart showing different steps performed by the system (100) in the learning stage. The learning stage is used for creating database of standard CAD models for each of the evaluation parameters are analyzed for a plurality of simplification points. The learning stage includes a plurality of steps or stages for creating a data base in the form of response surface.

At block 201, the at least one evaluation point in the standard computer-aided model for evaluation and the evaluation parameter that is to be calculated at the evaluation point is selected.

In an embodiment of the disclosure, evaluation parameter is a value which is used to certify properties of component after mechanical analysis.

At block 202, the processing unit (101) processes a plurality of simplification points and simplification parameters based on the selected of evaluation points and the evaluation parameter. After processing of the simplification points in the standard computer-aided model, the feature at these simplification points are simplified one after the other. Thereby, calculates values of evaluation parameters based on simplification parameters and determines relationship between evaluation parameter and simplification parameters.

At block 203, the processing unit (101) of the system (100) builds a response surface using the relationship between evaluation parameter and simplification parameters. The response surface is built based on the results obtained in the analysis of a standard computer-aided model after each simplification. Generally, in the relationship, the evaluation parameter is a function of the simplification parameters. The response surface built at this stage is stored in the memory unit (103) and this can be accessed by the processing unit (101) of the system (100) for execution in further stages.

Figure 3:
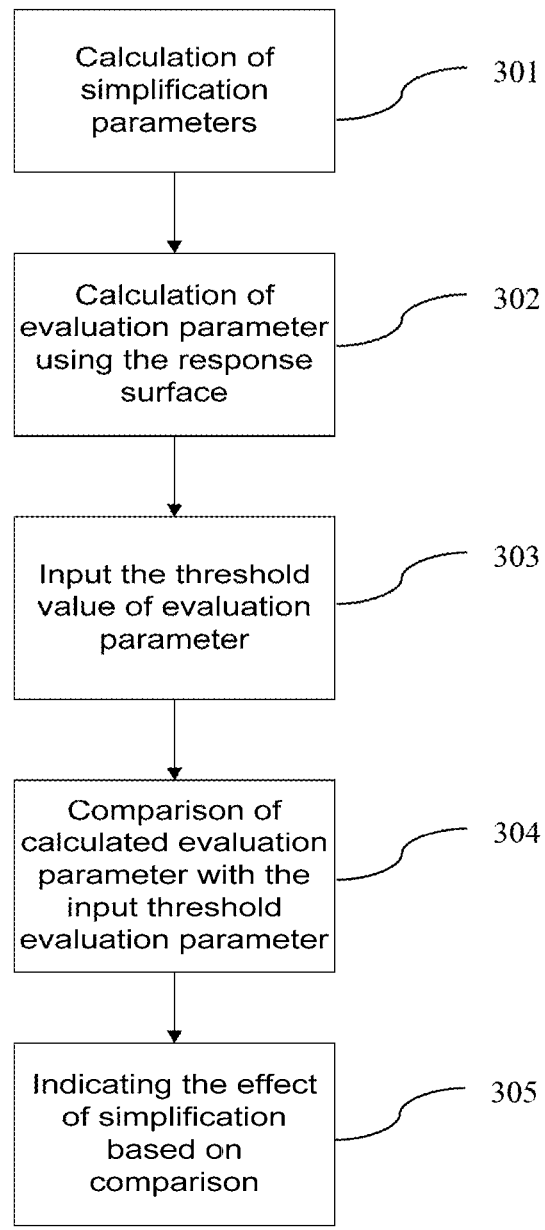
FIG. 3 illustrates a flow chart showing different steps performed by the system of FIG. 1 in the application stage, in accordance with some embodiment of the present disclosure.
Figure 4A:
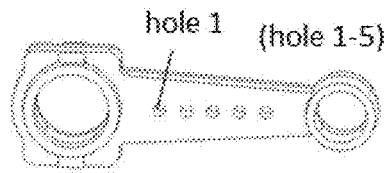
FIGS. 4A to 4E illustrates structural analysis of a connecting rod in the learning stage, in accordance with an exemplary embodiment of the present disclosure.
Figure 4B:
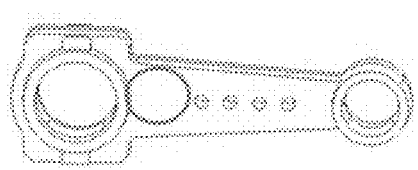
Figure 4C:
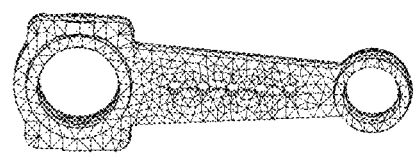
Figure 4D:
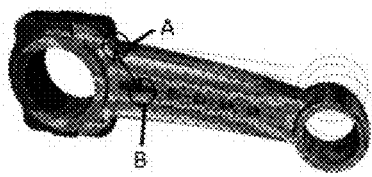
Figure 4E:
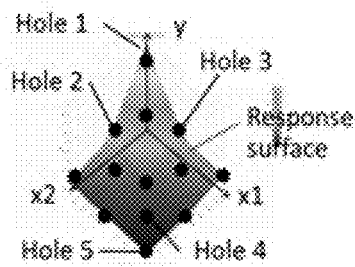

FIG. 3 is an exemplary embodiment of the present disclosure, which illustrates a flow chart showing different steps performed by the system (100) in the application stage. The application stage is platform available to the user for analyzing the CAD model. In this stage, fresh model is selected for analysis, this model referred to as the computer-aided model. This model would be closely relatable to the standard computer-aided model analysed in the learning stage.

At block 301, after the selection of fresh computer-aided model, it is subjected to simplification and mesh is generated in the computer-aided model for analysis. Once the mesh is generated, the processing unit (101) calculates the simplification parameters that affect the result of the evaluation parameter.

At block 302, the processing unit (101) calculates the value of evaluation parameter using the response surface built in the learning stage. This processing unit (101) accesses this response surface from the memory unit (102) of the system, thus significantly reduces the analysis time. The calculation of evaluation parameter is based on the relationship built in the response surface in which evaluation parameter is a function of the simplification parameters.

At block 303, the user is to input the threshold value of the evaluation parameter based on which the effect of simplification is indicated to the user.

At block 304, the processing unit (101) of the system (100) compares the result of the calculated evaluation parameter with that of the threshold value of the evaluation parameter for each simplification point.

At block 305, based on comparison done by the processing unit (101) it indicates the effect of simplification to the user on a display unit (103). The processing unit (101) compares to check if the calculated value of the evaluation parameter is within the input threshold value of the evaluation parameter. If the calculated value is within the safe range of threshold value of the evaluation parameter, the display unit (103) indicates OK else NG (Not Good) to the user.

FIGS. 4A to 4E is an exemplary embodiment of the present disclosure which illustrates structural analysis of a mechanical component, connecting rod in the learning stage. The connecting rod is an engine component that transfers motion from the piston to the crankshaft and functions as a lever arm. The connecting rod at this stage is referred to as the standard computer-aided model. In the instant example the connecting rod is analyzed for effect of stress at various evaluation points. Initially, in the learning stage, at least one evaluation point is selected for calculating evaluation parameter referred to as 'Y'. For instance, in this case point A is selected as the evaluation point at which stress concentration is to be evaluated. Further a parameter—'stress difference before and after simplification' is derived from the stress concentration at evaluation point. In this example, the parameter 'stress difference before and after simplification' is represented as 'Y'. Based on the selected evaluation point and evaluation parameter, the processing unit (101) processes a plurality of simplification points at which simplification of features could be considered without much deviation from the actual result i.e. the evaluation parameter 'Y' is to be minimal to obtain optimum analysis results after simplification. In an embodiment of the present disclosure, simplification points processed by the processing unit (101) are the points at which holes are present on the connecting rod i.e. holes 1-5 are processed as the simplification points. In an embodiment of the disclosure, two other parameters called the simplification parameters are processed by the processing unit (101) based on the selection of evaluation point and evaluation parameter. The 'stress value at simplification point' is one of the simplification parameters which is represented as 'X1' and the other simplification parameter is the 'distance of the simplification point from the evaluation point' which is represented as 'X2'. The distance of the simplification point from the evaluation point is the distance from point A to point B. The system (100) then subjects the connecting rod to simplification process wherein initially one of the holes is simplified, in the instant example hole 1 is simplified and mesh is generated for carrying out analysis of the model after simplification of hole 1. After analysis, several results are evaluated which affects the value 'Y' or stress concentration at the evaluation point. Further, these steps of meshing and analysis of results are repeated by simplifying several other features at the simplification points. In an embodiment of the present disclosure, holes 2-5 are simplified one after the other and after simplification the connecting rod is meshed to carry out analysis. In view of the analysis conducted after each simplification, the system (100) builds a response surface. The response surface herein above and below represents the relationship between the evaluation parameter and the simplification parameters. In an embodiment of the present disclosure, the building of response surface as shown in the figure is achieved by plotting points on a multi-planar surface with evaluation parameter and simplification parameters as different axes of the multi-planar surface. The response surface in the multi-planar surface represents relationship between parameters Y, X1 and X2. In an embodiment of the present disclosure, the evaluation parameter 'Y' is a function of simplification parameters X1 and X2. The response surface built in the learning stage is stored in the memory unit (102) of the system. The processing unit (101) accesses this response surface to minimize the analysis time in further stages such as application stage for simplification of analysis of a computer-aided model.

FIGS. 5A to 5E is an exemplary embodiment which illustrates structural analysis of a connecting rod in the application stage. In the application stage, a new variant of connecting rod is considered for analysis, the processing unit (101) relates this model to the standard computer-aided model stored in the memory unit (102) for analysis. The computer-aided model i.e. the connecting rod is subjected to simplification of features at a plurality of simplification points and mesh is generated to calculate several parameters that affect the result of evaluation parameter at the evaluation point. The processing unit (101) calculates the values of simplification parameters i.e. values of parameters X1 and X2 is calculated. The application stage is linked to the learning stage through the response surface. The parameter under consideration, i.e. the evaluation parameter Y is calculated using the response surface built in the learning stage which is stored in the memory unit (102). In an embodiment of the present disclosure, the value of 'Y' i.e. the 'stress difference before and after simplification' is calculated using the response surface. This is where a significant amount of time is saved in the application stage since the relationship is already built in the learning stage, the processing unit (101) just has to access this relationship and calculate the evaluation parameter. Further the user has to input the threshold value of evaluation parameter beyond which if the stress difference before and after analysis exceeds, then the concerned simplification feature is not considered to be good enough as the results after simplification deviates more than the allowable value. The threshold value of evaluation parameter is represented as 'Yo'. The system (100) has a display unit (103) to display the results of analysis, the display unit (103) indicates the feature simplified, the calculated value of evaluation parameter—'stress difference before and after simplification' and an indication if the feature is good enough for simplification. The processing unit (101) compares the results of the evaluation parameter 'Y' with the threshold value of evaluation parameter 'Yo'. Based on the comparison, the display unit (103) which is interfaced with the processing unit (101) indicates the effect of simplification to the user. As shown in the FIG. 4B the display unit (103) indicates the simplification points Hole1 to Hole5, another column indicates the value of stress difference before and after simplification (evaluation parameter) –Y, the third column displays the effect of simplification based on comparison of value of Y with the value of Yo. For instance, the value of Y when the analysis is carried out by simplifying hole 1 is 61 MPa and the input threshold value –Yo is 20 MPa. The processing unit (101) compares these two values, and since the value of Y is greater than Yo, the display unit (103) indicates the effect of simplification as 'NG' which means Not Good. This implies that simplification of Hole 1 is not possible since the analysis result deviates too much from the original analysis result without any simplification. Similarly, Hole 2 and Hole 3 cannot be considered for simplification hence the display unit (103) indicates NG in these cases as well. However in case of Hole 4 and Hole 5, simplification is possible as the value of Y is smaller than Yo and therefore the display unit (103) indicates the effect of simplification as OK. The indications on the display unit (103) are only examples. A person skilled in the art can provide the indication in various manners to a user. The indication in the examples of the disclosure is not a limitation but is one of the embodiments.

Figure 6A:
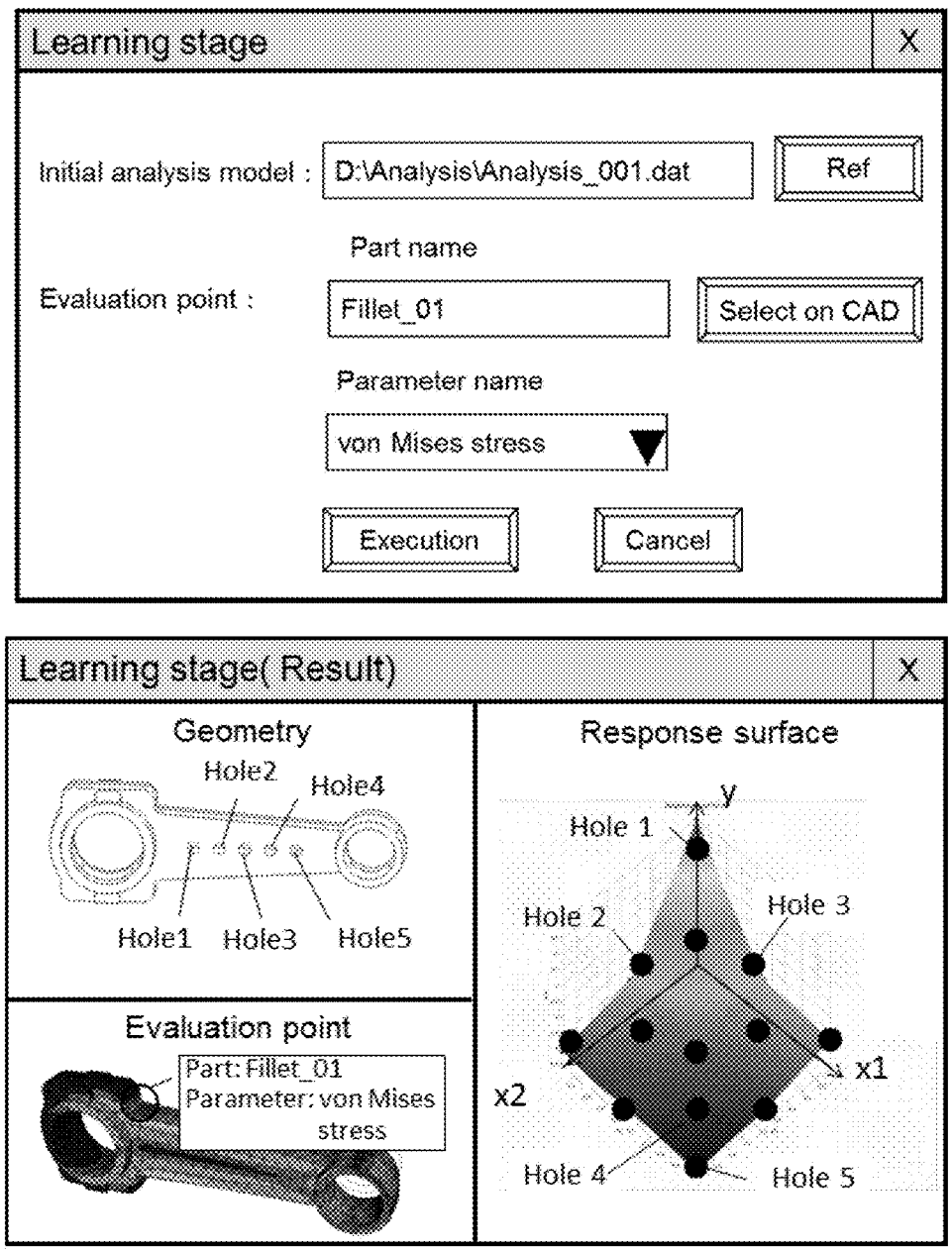
FIG. 6A illustrates graphic user interface of the system, for structural analysis of a connecting rod in the learning stage.
Figure 7A:
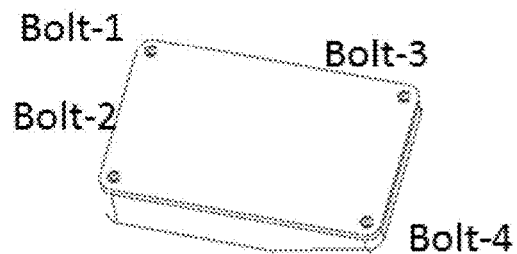
FIGS. 7A to 7D illustrates structural analysis of a computer mouse in the learning stage, in accordance with another exemplary embodiment of the present disclosure.
Figure 7B:
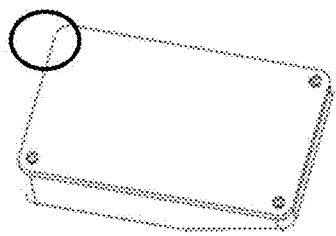
Figure 7C:
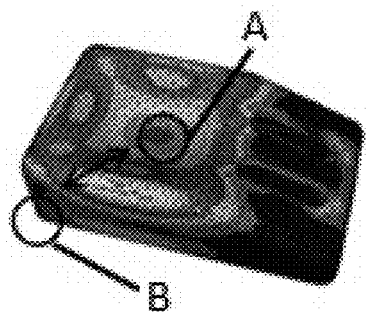
Figure 7D:
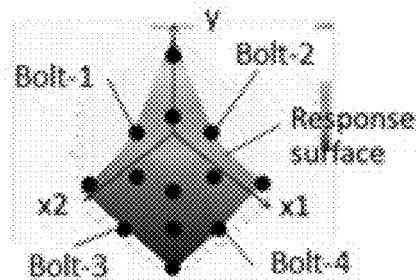

FIG. 6A is an exemplary embodiment of the present disclosure which illustrates graphic user interface in the system (100) for the learning stage with the example of structural analysis of the connecting rod. The initial analysis model referred to as the standard computer-aided model is input for which simplification is to be carried out. Then the evaluation point and the evaluation parameter is selected. In the instant example the evaluation point is chosen as the fillet in the connecting rod and the evaluation parameter is chosen as the Von Mises stress. After execution, the system (100) builds the response surface by meshing the model and carrying out analysis. The response surface which can be indicated by plotting points in a multi-planar surface with axes as the evaluation parameter and the simplification parameters are indicated to the user on the display unit (103).

FIG. 6B is an exemplary embodiment of the present disclosure, which illustrates graphic user interface in the system for the application stage with the example of structural analysis of a connecting rod. As shown in FIG. 5B, the user inputs a fresh analysis model which is substantially similar to the standard computer-aided model. The user then inputs the threshold value of the evaluation parameter, in this example threshold value Yo is input as 20 MPa and subject to execution. After execution, based on comparison by the processing unit (101), the display unit (103) of the system (100) indicates the effect of simplification as NG or OK for the user to decide.

FIGS. 7A to 7D and FIGS. 8A to 8D is another exemplary embodiment illustrating structural analysis of a computer mouse in the learning and application stages. The simplification of analysis of a computer mouse works on similar lines as that of simplifying analysis of a connecting rod as explained in the aforementioned paragraphs during explanation of FIG. 4A and FIG. 4B. Here the simplification features are considered as the bolts at four corners of the computer mouse and the evaluation point is point which is close to the center of the mouse, the evaluation parameter being the stress difference after and before simplification. Similar to the case of connecting rod, each simplification feature is simplified at the simplification points and the analysis is carried out. Based on the analysis after each simplification, a response surface is built which represents the relationship between the evaluation parameter or stress difference after and before analysis with the simplification parameters. The evaluation parameter is represented as Y and the simplification parameters are represented as X1 and X2, X1 being stress value at simplification point and X2 being distance of the simplification point from the evaluation point. This response surface is stored in the memory unit (103) of the system (100).

Further in the application stage a fresh model is selected with standard computer-aided model as a reference model. The computer-aided model is subject to analysis and the simplification parameters are calculated by the processing unit (101). The system then calculates the value of evaluation parameter or the value of Y using the response surface built in the learning stage. The processing unit (101) then compares the calculated values of evaluation parameter with that of the threshold value of evaluation parameter, based on this comparison the display unit (103) indicates the effect of simplification of features at simplification points to the user. This reduces analysis time and improves accuracy of analysis of the mouse.

In examples of the present disclosure, structural analysis of the CAD models is disclosed. However, such example should be construed as only possible embodiment of the present disclosure, as the method and system of the present disclosure can be used for any other type of mechanical analysis such as but not limiting to thermal analysis, and fluid flow analysis.

In an embodiment of the disclosure, the processing unit (101) of the system (100) for simplifying analysis of a computer-aided model may comprise at least one data processor for executing program components for executing user- or system-generated requests. The processor may include specialized processing units such as integrated system (bus) controllers, memory management control units, floating point units, graphics processing units, digital signal processing units, etc. The processing unit may include a microprocessor, such as AMD Athlon, Duron or Opteron, ARM's application, embedded or secure processors, IBM PowerPC, Intel's Core, Itanium, Xeon, Celeron or other line of processors, etc. The processing unit may be implemented using mainframe, distributed processor, multi-core, parallel, grid, or other architectures. Some embodiments may utilize embedded technologies like application-specific integrated circuits (ASICs), digital signal processors (DSPs), Field Programmable Gate Arrays (FPGAs), etc.

In some embodiments, the processing unit (101) may be disposed in communication with one or more memory devices (e.g., RAM, ROM etc.) via a storage interface. The storage interface may connect to memory devices including, without limitation, memory drives, removable disc drives, etc., employing connection protocols such as serial advanced technology attachment (SATA), integrated drive electronics (IDE), IEEE-1394, universal serial bus (USB), fiber channel, small computing system interface (SCSI), etc. The memory drives may further include a drum, magnetic disc drive, magneto-optical drive, optical drive, redundant array of independent discs (RAID), solid-state memory devices, solid-state drives, etc.

In some embodiments, the memory unit (102) may store data as described in this disclosure. Such databases may be implemented as fault-tolerant, relational, scalable, secure databases such as Oracle or Sybase. Alternatively, such databases may be implemented using standardized data structures, such as an array, hash, linked list, struct, structured text file (e.g., XML), table, or as object-oriented databases (e.g., using ObjectStore, Poet, Zope, etc.). Such databases may be consolidated or distributed, sometimes among the various computing units discussed above in this disclosure. It is to be understood that the structure and operation of the any computer or database component may be combined, consolidated, or distributed in any working combination.

Furthermore, one or more computer-readable storage media may be utilized in implementing embodiments consistent with the present disclosure. A computer-readable storage medium refers to any type of physical memory on which information or data readable by a processor may be stored. Thus, a computer-readable storage medium may store instructions for execution by one or more processors, including instructions for causing the processor(s) to perform steps or stages consistent with the embodiments described herein. The term "computer-readable medium" should be understood to include tangible items and exclude carrier waves and transient signals, i.e., are non-transitory. Examples include random access memory (RAM), read-only memory (ROM), volatile memory, non-volatile memory, hard drives, CD ROMs, DVDs, flash drives, disks, and any other known physical storage media.

Advantages of the Present Disclosure:

The present disclosure provides a computer-implemented method for simplifying analysis of a computer-aided model that reduces computational time in analysing a computer-aided model.

The present disclosure provides a computer-implemented method for simplifying analysis of a computer-aided model that reduces improves accuracy of the analysis by avoiding manual errors during simplification.

EQUIVALENTS

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding the description may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, or drawings, should be understood to contemplate the possibilities of including one of the terms, either of the terms, or both terms. For example, the phrase "A or B" will be understood to include the possibilities of "A" or "B" or "A and B."

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated in the description.

Table of Referral Numerals:

| Reference Number | Description |
| --- | --- |
| 100 | System for simplifying analysis of a computer-aided model |
| 101 | Processing unit |
| 102 | Memory unit |
| 103 | Display unit |
| 201-203 | Flow - chart blocks in FIG. 2 |
| 301-305 | Flow - chart blocks in FIG. 3 |
| Y | Evaluation parameter |
| X1 and X2 | Simplification parameters |
| Yo | Threshold value of evaluation parameter |
| A | Evaluation point |
| B | Simplification point |

I claim:

1. A computer-implemented method for simplifying analysis of a computer-aided model, the method comprising:
    selecting at least one evaluation point in a standard computer-aided model;
    analyzing the standard computer-aided model by simplifying each of a plurality of simplification points for the selected at least one evaluation point;
    building a response surface using a relationship between simplification parameters and an evaluation parameter based on analysis of the standard computer-aided model, wherein the relationship between the evaluation parameter and simplification parameters includes plotting points in a graphical space that depict dependencies between the evaluation parameter and the simplification parameters, wherein the graphical space has evaluation parameter and simplification parameters as different axes; and
    indicating an effect of simplification of at least one simplification point in the computer-aided model by comparing the calculated evaluation parameter of the computer-aided model with a threshold evaluation parameter, wherein, the calculated evaluation parameter is derived using the response surface.

2. The method as claimed in claim 1, wherein the evaluation parameter and simplification parameters are determined during analysis of the standard computer-aided model.

3. The method as claimed in claim 1, wherein the evaluation parameter is a parameter to be evaluated in at least one evaluation point.

4. The method as claimed in claim 1, wherein the evaluation parameter is a function of the simplification parameters.

5. The method as claimed in claim 1, wherein the standard computer-aided model is analyzed for a plurality of evaluation points by simplifying each of the plurality of simplification points for the selected evaluation point of the plurality of evaluation points.

6. The method as claimed in claim 1, wherein the response surface of the standard computer-aided model is stored in a memory unit.

7. The method as claimed in claim 1, wherein the simplification parameters are determined by analyzing the computer-aided model.

8. A system for simplifying analysis of a computer-aided model, comprising:
    a processing unit; and
    a memory unit communicatively coupled to the processing unit, wherein the memory unit stores processor-executable instructions, which, on execution, causes the processing unit to:

select at least one evaluation point in a standard computer-aided model;

analyze the standard computer-aided model by simplifying each of a plurality of simplification points for the selected at least one evaluation point;

build a response surface using a relationship between simplification parameters and an evaluation parameter based on analysis of the standard computer-aided model, wherein the relationship between the evaluation parameter and simplification parameters includes plotting points in a graphical space that depict dependencies between the evaluation parameter and the simplification parameters, wherein the graphical space has evaluation parameter and simplification parameters as different axes; and indicate an effect of simplification of at least one simplification point in the computer-aided model by comparing the calculated evaluation parameter of the computer-aided model with a threshold evaluation parameter, wherein, the calculated evaluation parameter is derived using the response surface.

9. The system as claimed in claim 8 comprises a display unit interfaced with the processing unit to indicate the effect of simplification.

10. The system as claimed in claim 8, wherein the memory unit is configured to store the response surface.

11. A non-transitory computer readable medium including instruction stored thereon that when processed by at least one processor cause the processor to perform operations comprising:

selecting at least one evaluation point in a standard computer-aided model;

analyzing the standard computer-aided model by simplifying each of a plurality of simplification points for the selected at least one evaluation point;

building a response surface using a relationship between simplification parameters and an evaluation parameter based on analysis of the standard computer-aided model, wherein the relationship between the evaluation parameter and simplification parameters includes plotting points in a graphical space that depict dependencies between the evaluation parameter and the simplification parameters, wherein the graphical space has evaluation parameter and simplification parameters as different axes; and indicating an effect of simplification of at least one simplification point in the computer-aided model by comparing the calculated evaluation parameter of the computer-aided model with a threshold evaluation parameter, wherein the calculated evaluation parameter is derived using the response surface.

* * * * *